United States Patent [19]

Sakuma et al.

[11] 4,394,674

[45] Jul. 19, 1983

[54] INSULATED GATE FIELD EFFECT TRANSISTOR

[75] Inventors: Hiraku Sakuma; Toshiyuki Suzuki, both of Tokyo, Japan

[73] Assignee: Nippon Electric Co., Ltd., Tokyo, Japan

[21] Appl. No.: 195,683

[22] Filed: Oct. 9, 1980

[30] Foreign Application Priority Data

Oct. 9, 1979 [JP] Japan .................................. 54-130143
Nov. 13, 1979 [JP] Japan .................................. 54-146668

[51] Int. Cl.³ ............................................ H01L 29/78
[52] U.S. Cl. ........................................ 357/23; 357/20; 357/41; 357/86; 357/89
[58] Field of Search ............. 357/23 R, 23 HV, 23 S, 357/41, 42, 89, 86, 20

[56] References Cited

U.S. PATENT DOCUMENTS

| | | | |
|---|---|---|---|
| 3,821,776 | 6/1974 | Hayashi et al. | 357/23 VD |
| 4,035,826 | 7/1977 | Morton | 357/42 |
| 4,334,235 | 6/1982 | Nishizawa | 357/23 R |

FOREIGN PATENT DOCUMENTS

| | | | |
|---|---|---|---|
| 53-72471 | 6/1978 | Japan | 357/23 HV |
| 7804028 | 10/1978 | Netherlands | 357/23 HV |

Primary Examiner—William D. Larkins
Attorney, Agent, or Firm—Sughrue, Mion, Zinn, Macpeak and Seas

[57] ABSTRACT

Parasitic bipolar action is prevented in a high voltage MOSFET by a substrate contact region underlying the bottom of the source region and shorted to the source, to prevent forward bias of the source.

9 Claims, 19 Drawing Figures

INSULATED GATE FIELD EFFECT TRANSISTOR

BACKGROUND OF THE INVENTION

The present invention relates to an insulated gate field effect transistor, and more particularly to an insulated gate field effect transistor having a high drain breakdown voltage.

An insulated gate field effect transistor is essentially excellent as a high-speed power device for the reasons that thermal runaway would not occur because the temperature coefficient of the drain current is negative, that high-speed operation is possible since it is a majority carrier device, and that it has a high input resistance and a high power gain.

However, the drain breakdown voltage of the insulated gate field effect transistor, a typical example of which is an MOS transistor, and which has been heretofore used in an integrated circuit or the like, is as low as only about 50 to 60 V. Thus, in order to broaden the scope of the application as power devices of the MOS transistor it was essentially necessary to make it have a high drain breakdown voltage. In response to this requirement, high breakdown voltage MOS transistors of DSA structure, tetrode structure, offset gate structure, etc. have been proposed in the prior art. Among these proposed devices the offset gate MOS transistor is especially hopeful as a high breakdown voltage device for use in an integrated circuit because the structure is simple. With regard to the transistor having an offset gate structure, reference should be made, for example, to Journal of the Japan Society of Applied Physics, Vol. 44, Supplement 1975, pp. 249 to 255. In the offset gate MOS transistor, a low impurity concentration region of the same conductivity type as the drain is provided between a drain and a gate electrode, and upon application of a high drain voltage the low impurity concentration region becomes a depletion layer and thereby serves to raise the drain breakdown voltage.

Generally, a MOS field effect transistor comprises, in the case of an N-channel type, an N-type impurity region forming a source, a P-type region serving as a substrate and an N-type impurity region forming a drain, and such structure can be deemed to be an NPN bipolar transistor structure using the source as an emitter, the base as a substrate and the drain as a collector. In other words, one can consider that the above-mentioned NPN bipolar transistors is parasitic on such MOS field effect transistor.

It has been known that the effect of this parasitic bipolar device is remarkable in high breakdown voltage MOS transistors having a substrate of high specific resistance, and in shortchannel MOS transistor in which the shortness of the channel corresponds to a narrow base width of the parasitic bipolar transistor, and thus a negative resistance phenomenon appears in the drain voltage vs. drain current characteristics. Such a negative resistance phenomenon is explained to be the so-called parasitic bipolar effect that is generated by the fact that an avalanche breakdown of a PN-junction between drain and substrate is triggered and minority carriers in the bipolar operation are injected from the source region into the substrate, and it is especially remarkable in an N-type MOS transistor in which electrons having a large avalanche multiplying factor act as current carriers. Furthermore, in a high breakdown voltage MOS transistor, the substrate has a low impurity concentration, so as to raise the breakdown voltage of the PN-junction between the drain region and the substrate region. This corresponds to a rise in the base resistance in a bipolar parasitic bipolar transistor, and in such a case, the source-substrate PN-junction, that is, the emitter-base junction of the parasitic bipolar transistor can be easily forwardly biased even by a slight drain-substrate avalanche current, that is, collector-base current, and hence the negative resistance phenomenon becomes more and more liable to appear. Moreover, MOS transistors having a high breakdown voltage is generally used with a high drain voltage. Therefore, if current concentration occurs at a drain junction during the process of transition to the above-mentioned negative resistance condition, then a large power is applied to the junction, thereby readily resulting in thermal destruction. Such a phenomenon is disclosed in IEEE Transactions Electron Devices, Vol. ED-27, No. 2, February 1980, pages 395 to 398.

As an effective solution for preventing such negative resistance phenomena and thermal destruction phenomena, a high-resistance P-type silicon layer is epitaxially grown on a low-resistance P-type silicon body, and an N-channel MOS transistor is formed along the surface of the layer. In the device of the above-described structure, the avalanche-injected holes are absorbed by the low-resistance body section, and the rise of substrate potential in the proximity of the source region is suppressed, and thus the parasitic bipolar effect is removed.

However, for the realization of the above-described structure, the epitaxial growth of a high specific resistance silicon layer as thick as ten to twenty microns is necessitated, and this becomes one cause of the high cost of the devices. Moreover, in the case where it is desired to obtain an N-channel MOS transistor having a higher drain breakdown voltage, it is necessary to grow an even thicker epitaxial layer having a higher specific resistance that of than the above-mentioned example. According to present silicon epitaxial techniques, however, epitaxial growth of at most 20 to 30 microns in thickness is the practical limit, and because of a high specific resistance layer, even the control of impurity concentration of the order of $10^{14}$ cm$^{-3}$ is not easy.

Accordingly, it has been difficult to realize an N-channel MOS transistor having a high breakdown voltage and an excellent characteristic which suppresses the negative resistance phenomena in a substrate consisting of a low-resistance P-type body and a high-resistance epitaxial layer grown on the body.

SUMMARY OF THE INVENTION

It is therefore one object of the invention to provide an insulated gate field effect transistor which can suppress the negative resistance phenomena, which has a high drain breakdown voltage, and which is easy to manufacture.

According to one feature of the present invention, there is provided an insulated gate field effect transistor comprising a semiconductor substrate of one conductivity type, a source region and a drain region of the opposite conductivity type formed along one principal surface of the semiconductor substrate, a channel region between the source region and the drain region, a gate electrode provided on the channel region via a gate insulating film, and an impurity region of the one conductivity type having a higher impurity concentration than the semiconductor substrate, the impurity region being provided in contact with substantially the entire bottom of the source region excluding the side wall of the source region on the side of the channel region and led out to the one principal surface. The impurity region is led out to the principal surface through a region other than the channel region, and may be ohmically connected to a source electrode to be short-circuited with the source region.

According to another feature of the present invention, there is provided an insulated gate field effect transistor of an offset gate structure comprising a source region, a drain region, a gate electrode, an offset gate region in contact with the drain region and having a low impurity concentration of the same conductivity type as the drain region, and a buried layer of a high impurity concentration region of different conductivity type from the drain region formed in such a manner that one end of the buried layer is electrically connected to the source electrode and surrounds the source region except the channel surface region and such that the other end of the buried layer extends to the proximity of the underside of the end of the offset gate region.

According to still other feature of the present invention, there is provided an insulated gate field effect transistor comprising a semiconductor substrate of one conductivity type, a drain region of the opposite conductivity type provided along one principal surface of the semiconductor substrate, an offset gate region of the opposite conductivity type having a lower impurity concentration and a shallower depth than the drain region, the offset gate region extending from the drain region to a channel region and being disposed so as to surround the drain region, a channel region formed in a ring shape surrounding the offset region, a ring-shaped gate electrode provided on the channel region via a gate insulating film, a source region of the opposite conductivity type formed in a ring shape surrounding the channel region with its inner circumference adjoining the channel region, an impurity region of the one conductivity type having a higher impurity concentration than the semiconductor substrate, which impurity region makes contact with substantially the entire bottom surface of the source region, adjoins to the outer circumference of the source region and is led out to the one principal surface of the semiconductor substrate, and a source electrode connected in common to the source region and the impurity region.

In the above-featured structure according to the present invention, the high impurity concentration region is formed to remove the negative resistance characteristics, and hence it is only necessary that the high impurity concentration region is adjacent to the bottom of the source region or further extend from the bottom right up to the underside of the channel region, never entering into the channel region. In other words, this high impurity concentration region is not adjacent to a portion of the surface region facing the channel region. If the high impurity concentration region enters into the channel region, then the threshold voltage is restrained by that region, and hence it becomes impossible to controllably obtain the inherent performances of the insulated gate field effect transistor.

The above-mentioned and other features and objects of the present invention will become more apparent by reference to the following description of preferred embodiment of the invention taken in conjunction with the accompanying drawings.

DESCRIPTION OF THE PREFERRED EMBODIMENTS

Figure 1:
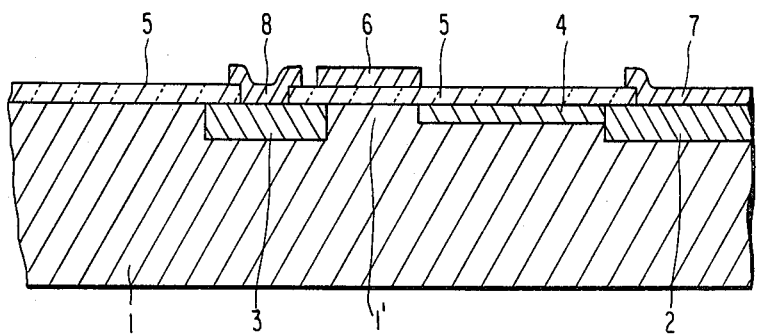
FIG. 1 is a schematic cross-sectional view of an offset gate MOS transistor which is one of the insulated gate field effect transistors in the prior art.

Referring now to FIG. 1 which shows one example of a prior art offset gate MOS transistor having high breakdown voltage, in a low impurity concentration semiconductor substrate 1 made of P-type silicon having an impurity concentration of about $5 \times 10^{-4}$ cm$^{-3}$ are formed a drain region 2 and a source region 3, respectively, consisting of N-type high impurity concentration regions formed by a thermal diffusion process, and an offset gate region 4 consisting of an N-type low impurity concentration region having a thickness of about 1300 Å and an impurity concentration of about $3 \times 10^{16}$ cm$^{-3}$ formed, for example, by an ion implentation process so as to extend from the drain region 2. A gate electrode 6 made of polycrystalline silicon or metal such as aluminum or the like which has a low specific resistance is provided on the surface portion right above a channel region 1' of a gate insulating film 5 consisting of a silicon oxide film of about 1300 Å in thickness, and a drain electrode 7 and a source electrode 8 respectively made of metal such as aluminum are connected to the drain region 2 and the source region 3, respectively.

When a drain voltage applied to the drain electrode 7 is small, the offset gate region 4 acts as a mere resistance, so that the drain voltage is applied across the channel region 1' where an inversion layer is induced by the gate voltage applied to the gate electrode 6. As the drain voltage increases, when the voltage applied across the channel region exceeds the gate voltage, the current flowing through the channel region becomes a constant current that is determined by the gate voltage. Accordingly, the drain current flowing through the drain electrode 7 becomes constant and thus presents a saturation characteristic. If the drain voltage is further increased, then a depletion layer extending into the offset gate region 4 from the PN-junction formed by the offset gate region 4 and the low impurity concentration semiconductor substrate 1 becomes large, and soon pinch-off occurrs in the offset gate region 4. Increase in the drain voltage after the pinch-off has occurred in the offset gate region 4 is entirely absorbed by the depletion layer extending between the pinch-off point and the drain region 2, similarly to the junction type field effect transistor. Accordingly, an excessive voltage higher than the pinch-off voltage of the offset gate region 4 would not be applied across the channel region, and therefore, if the pinch-off voltage is selected smaller than the breakdown voltage at the channel region, and the edge of the offset gate region, it would never occur that the drain breakdown voltage is limited by the breakdown at the channel region. On the other hand, the offset gate region 4 can be made to have a sufficiently high breakdown voltage by selecting the impurity concentration of the low impurity concentration semiconductor substrate 1 at a low value, and hence, as a whole an insulated gate field effect transistor having a high drain breakdown voltage.

Figure 2:
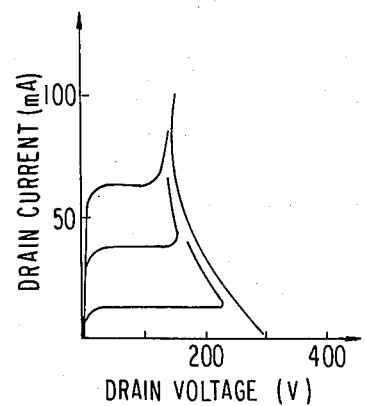
FIG. 2 shows representative drain voltage vs. current characteristics of the prior art offset gate MOS transistor in FIG. 1.

FIG. 2 shows one example of the electric characteristics of the offset gate structure MOS transistor shown in FIG. 1. When avalanche breakdown occurs in the drain region 2, in the case of an N-channel device, the drain voltage vs. current characteristics abruptly switch back to a low voltage, high current state. Due to this negative resistance phenomenon, the device has shortcomings in that it is liable to be subjected to permanent destruction or abnormal oscillation caused by the negative resistance.

In order to eliminate such a negative resistance phenomenon in an N-channel device, it is only necessary to decrease the voltage drop caused by a hole current in the low impurity concentration semiconductor substrate. In other words, it is only necessary to reduce the effective resistance of the low impurity concentration semiconductor substrate against the hole current.

Figure 3:
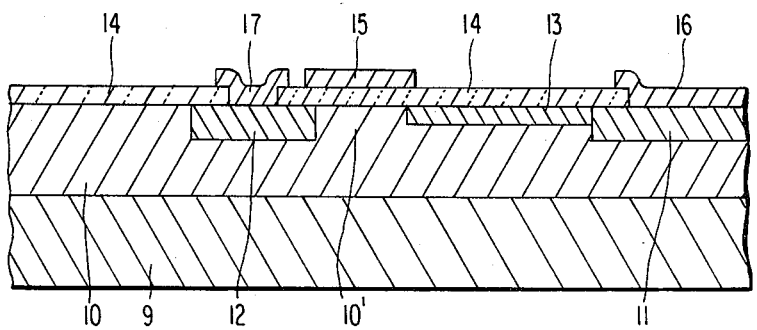
FIG. 3 is a schematic cross-sectional view showing an improved structure in the prior art which was proposed to prevent a parasitic bipolar effect in the structure shown in FIG. 1.

FIG. 3 shows a cross-sectional structure of an offset gate type insulated-gate field effect transistor in the prior art, in which a semiconductor substrate consisting of a high impurity concentration body 9 and a low impurity concentration layer 10 both of the same conductivity type are employed for the purpose of reducing the effective resistance of the semiconductor substrate. More particularly, on a high impurity concentration body 9 made of P-type silicon and having an impurity concentration of $2 \times 10^{19}$ cm$^{-3}$ is provided a low impurity concentration layer 10 of a P-type silicon layer of $8 \times 10^{14}$ cm$^{-3}$ in impurity concentration and about 16 μm in thickness. A drain region 11 and a source region 12, respectively, consisting of N-type high impurity concentration regions are formed in this layer 10 as by a thermal diffusion process, and an offset gate region 13 consisting of an N-type low impurity concentration region having a thickness of about 1300 Å and an impurity concentration of about $3 \times 10^{16}$ cm$^{-3}$ is formed by an ion implantation process so as to extend from the drain region 11 towards a channel region 10'. A gate electrode 15 made of polycrystalline silicon or metal such as aluminum which has a low specific resistance is provided on a gate insulating film 14 consisting of a silicon oxide film having a thickness of about 1300 Å, and a drain electrode 16 and a source electrode 17 both made of metal such as aluminum are connected to the drain region 11 and the source region 12, respectively. The low impurity concentration layer 10 has its concentration and thickness selected so that a depletion layer extending from the drain 10 may sufficiently expand therein, and it would never occur that the depletion layer reaches the high impurity concentration simiconductor body 9. Accordingly, the high impurity concentration semiconductor body 9 does not effect the operation of the device. On the other hand, once avalanche breakdown should occur within the depletion layer extending from the drain region 11, the hole current would flow into the low impurity concentration layer 10, but most of the hole current would be absorbed by the high impurity concentration semiconductor body 9 before a voltage drop occurs at the vicinity of the source region 12. Accordingly, as a whole, the vltage drop caused by the hole current is very small, so that injection of electrons from the source region 12 to the low impurity concentration layer 10 would not arise. Consequently, the drain current presents such characteristics that it rises abruptly at the drain voltage of about 220 V due to avalanche brakdown, and therefore the negative resistance phenomenon would not be generated.

However, in the prior art structure illustrated in FIG. 3, it is necessary to select the impurity concentration and the thickness of the low impurity concentration layer 10 in such manner that, within a predetermined range of a drain voltage, the depletion layer extending from the drain region 11 may not be intercepted by the high impurity concentration semiconductor body 9. More particularly, if it is desired to increase the drain breakdown voltage to about 300 V, it is necessary to select the impurity concentration at about $6 \times 10^{14}$ cm$^{-3}$ and the thickness at 26 μm at the lowest. In order to provide such a double-layer structure consisting of a low impurity concentration layer and a high impurity concentration body, at the present the method employing the epitaxial growth technique is most excellent. However, in low impurity concentration layers 10 which can be grown on a high impurity concentration body 9 with a good yield through the epitaxial growth technique at present, the impurity concentration is $7 \times 10^{14}$ cm$^{-3}$ or higher and the thickness is 25 μm or less. Accordingly, in the case of the device structure shown in FIG. 3, naturally the obtainable breakdown voltage has an upper limit, and it is very difficult to manufacture the devices with a good yield.

In the following, the present invention will be explained in greater detail with reference to FIGS. 4 to 11.

Figure 4:
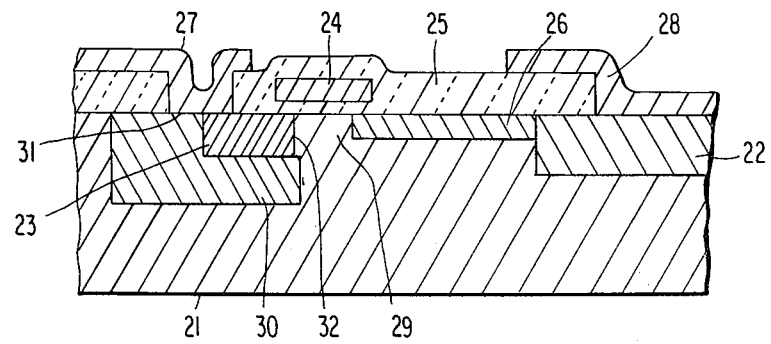
FIG. 4 is a schematic cross-sectional view showing an outline of a first preferred embodiment of the present invention.

One preferred embodiment of the high voltage MOS field effect transistor according to the present invention is shown in cross-section, in FIG. 4. In the illustrated structure, an N+-type drain region 22 and an N+-type source region 23 are provided in a P-type low impurity concentration substrate 21, and an N−-type extension drain region 26 extends from the drain region 22 towards a channel region 29 up to the proximity of one end of a gate electrode 24. A P+-type high impurity concentration region 30 according to the present invention is provided so as to extend from a principal surface of the substrate 21 and to be adjacent to the source region 23. A drain electrode 28 is connected to the drain region 22 through an aperture in an insulating film 25, and likewise in a contact aperture region 31, the source region 23 and the P+-type high impurity concentration region 30 are ohmically connected to a source electrode 27.

In the device having the above-described structure, a source region 23 in a MOS transistor is surrounded by a high impurity concentration region 30 of different conductivity type from the source region and at the same potential as the source region, except for a channel region 29 right under a gate electrode 24, and therefore, an effective emitter region contributing to the parasitic bipolar effect is almost not present. More particularly, the effective emitter region in the parasitic bipolar device of the above-described MOS transistor is only the side surface portion 32 of the sourceregion 23 facing to the channel region 29, that is, opened on the side of the channel region 29, and the depth of the above-mentioned side portion is at most about several thousands Å to 4 μm, so that the effective emitter region is extremely small as compared to the prior art MOS transistor shown in FIG. 1. Furthermore, the substrate region in the proximity of the side portion 32 of the source region 23 is firmly held at the source potential through the low impurity concentration region 30 having the same conductivity type as the substrate and a low resistance, and hence holes avalanche-injected into the substrate are absorbed by this high impurity concentration region 30, so that the side portion 32 of the source region 23 would not be forwardly biased with respect to the substrate region 21, and therefore, the parasitic bipolar effect can be entirely suppressed.

Figure 5A:
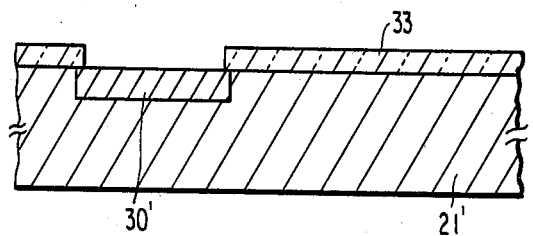
FIGS. 5A to 5E, FIGS. 6A and 6B and FIGS. 7A and 7B are cross-sectional views showing three different processes, respectively in part, for manufacturing the insulated gate field effect transistor according to the first preferred embodiment of the present invention shown in FIG. 4.
Figure 5B:
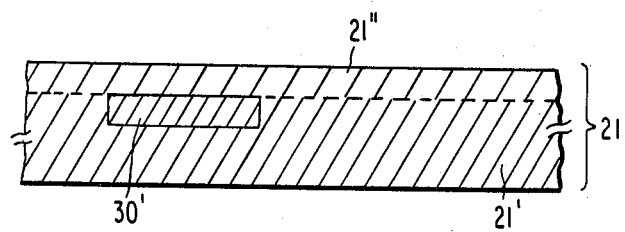
Figure 5C:
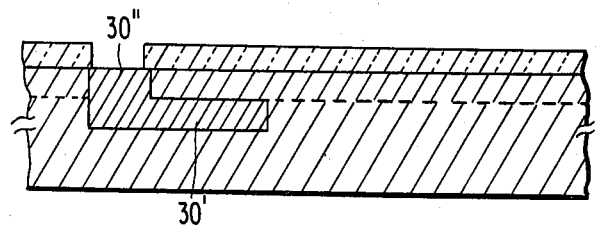
Figure 5D:
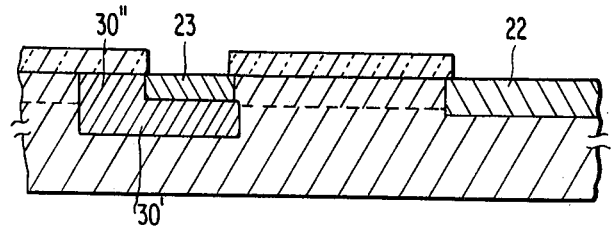
Figure 5E:
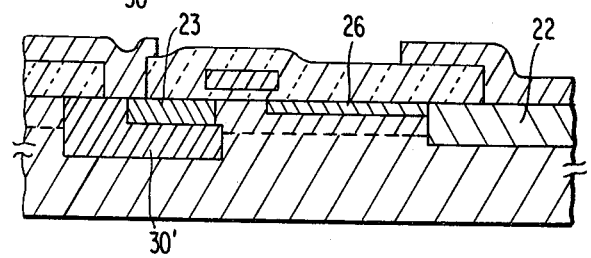

FIGS. 5A to 5E are schematic views to be used for explaining one example of a manufacturing process for realizing the transistor according to the preferred embodiment shown in FIG. 4, and these figures show cross-sections of the device in the principal steps of the process. In the case of an N-channel MOS transistor, at first in the portion of a high specific resistance P-type body 21' in which portion a source region is to be provided in the future, for instance, a P+-region 30' having an impurity concentration of $1 \times 10^{18}$ cm$^{-3}$ or higher and a depth of about 1.5 μm is selectively diffused by employing a silicon oxide film 33 as a mask (FIG. 5A). Next, a thin P-type silicon layer 21" is epitaxially grown over the entire substrate surface (FIG. 5B). This substrate 21' and the layer 21" form a composite substrate 21. Thereafter, a P+-type diffused layer 30" is provided in the layer 21" for the purpose of grounding the substrate and leading out an electrode for a P+-type buried layer 30' (FIG. 5C). This layer 30' and the region 30" jointly form a P+ high impurity concentration region 30 according to the present invention. The subsequent steps for providing drain and source regions 22 and 23, an offset gate low impurity concentration region 26, etc. are similar to the manufacturing steps of the high breakdown voltage MOS transistor in the prior art (FIGS. 5D and 5E).

The thus manufactured high breakdown voltage N-channel MOS transistor does not generate a negative resistance phenomenon nor a secondary breakdown phenomenon as generated in the transistor having the structure shown in FIG. 1 at all, and it presents a stable operation characteristic.

Figure 6A:
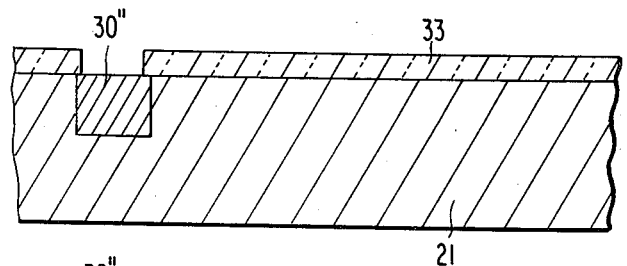
Figure 6B:
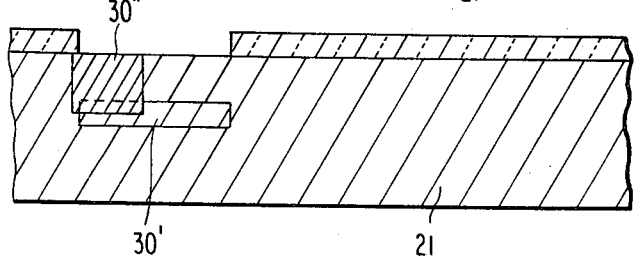

FIGS. 6A and 6B are schematic views to be used for explaining another manufacturing process for realizing the transistor according to the preferred embodiment shown in FIG. 4, and these figures show cross-sections of the device in the principal steps of the process. In this manufacturing process, at first a P+-type impurity region 30" for grounding a substrate 21 is provided (FIG. 6A), and subsequently a high impurity concentration 30' is formed by high acceleration voltage ion injection of boron ions right under the region where a source region is to be formed later (FIG. 6B). In the subsequent steps, the device is manufactured according to the manufacturing process of the prior art high breakdown voltage MOS transistors similar to the steps shown in FIGS. 5D and 5E. This manufacturing process is different from that shown in FIGS. 5A to 5E in that epitaxial growth is unnecessary.

Figure 7A:
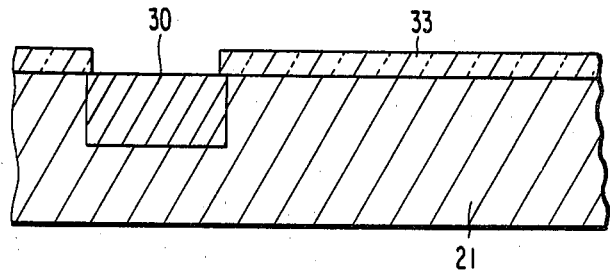
Figure 7B:
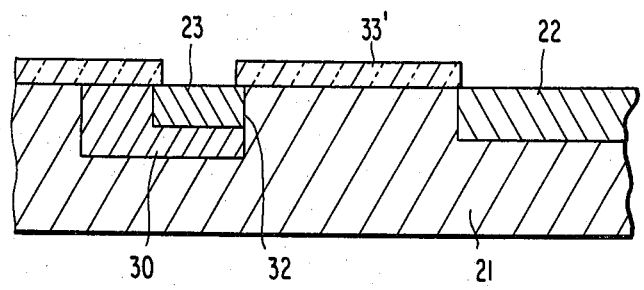

FIGS. 7A and 7B are schematic views to be used for explaining still another process for realizing the transistor according to the preferred embodiment shown in FIG. 4, and these figures show cross-sections of the device in the principal steps of the process. In this manufacturing process, at first, P+ diffusion is effected in the proximity of the region which is to be converted later into a source region 23 for the purpose of providing a high impurity concentration region 30 of the same conductivity type as the substrate which is characteristic of the present invention (FIG. 7A). Subsequently, a drain region 22 and a source region 23 are formed through N+ diffusion by making use of a new oxide film diffusion mask 33' as shown in FIG. 7B.

In this case, the N+-type diffused region 23 can be formed by selecting the impurity concentration of the same region higher than the impurity concentration of the P+-type diffused region 30. In addition, the relative positioning of the oxide film diffusion masks 33 and 33' as well as the temperature conditions for the N+ and P+ diffusions are established in such manner that as shown in FIG. 7B the side surface 32 of the N+ source region 23 for forming a MOS channel can be eventually connected to the MOS channel without being completely surrounded by the laterally diffusion P+ -type diffused region 30, and substantially all the bottom surface of the source region 23 may contact with the P+ -type high impurity concentration region 30.

While a number of manufacturing processes for realizing the insulated gate field effect transistor according to the present invention have been described above, as will be apparent from the above description, in the respective manufacturing processes either an epitaxial growth step is unnecessary or only thin layer of at most several μm in thickness must be epitaxially grown, and therefore, the realization of the insulated gate field effect transistor according to the present invention is very simple. In addition, in the case of an MOS transistor having a high drain breakdown voltage, since a low resistance body 9 as seen in the prior art transistor shown in FIG. 3 does not exist in the proximity of the drain diffused region 22, the drain breakdown voltage can be easily raised, as compared to the prior art transistor, by employing a substrate having a sufficiently high specific resistance.

Furthermore, the parasitic bipolar effect can be perfectly suppressed, because the area of the source region serving as an emitter is limited to only the MOS channel section side surface 32 of the source region 23, and also because the substrate potential in the proximity of the source region side surface 32 per se is also fixed at the source potential, as described previously.

Although the insulated gate field effect transistor according to the present invention has been described above in connection with its preferred embodiment as applied to an offset gate structure high breakdown voltage N-channel MOS transistor whose effects are especially remarkable, it is obvious that the present invention is equally applicable to a high breakdown voltage P-channel MOS transistor, and further, as a matter of course it is equally applicable to other high breakdown voltage MOS transistors or generally to insulated gate field effect transistors such as MOS transistors whose parasitic bipolar effects are desired to be suppressed.

Figure 8A:
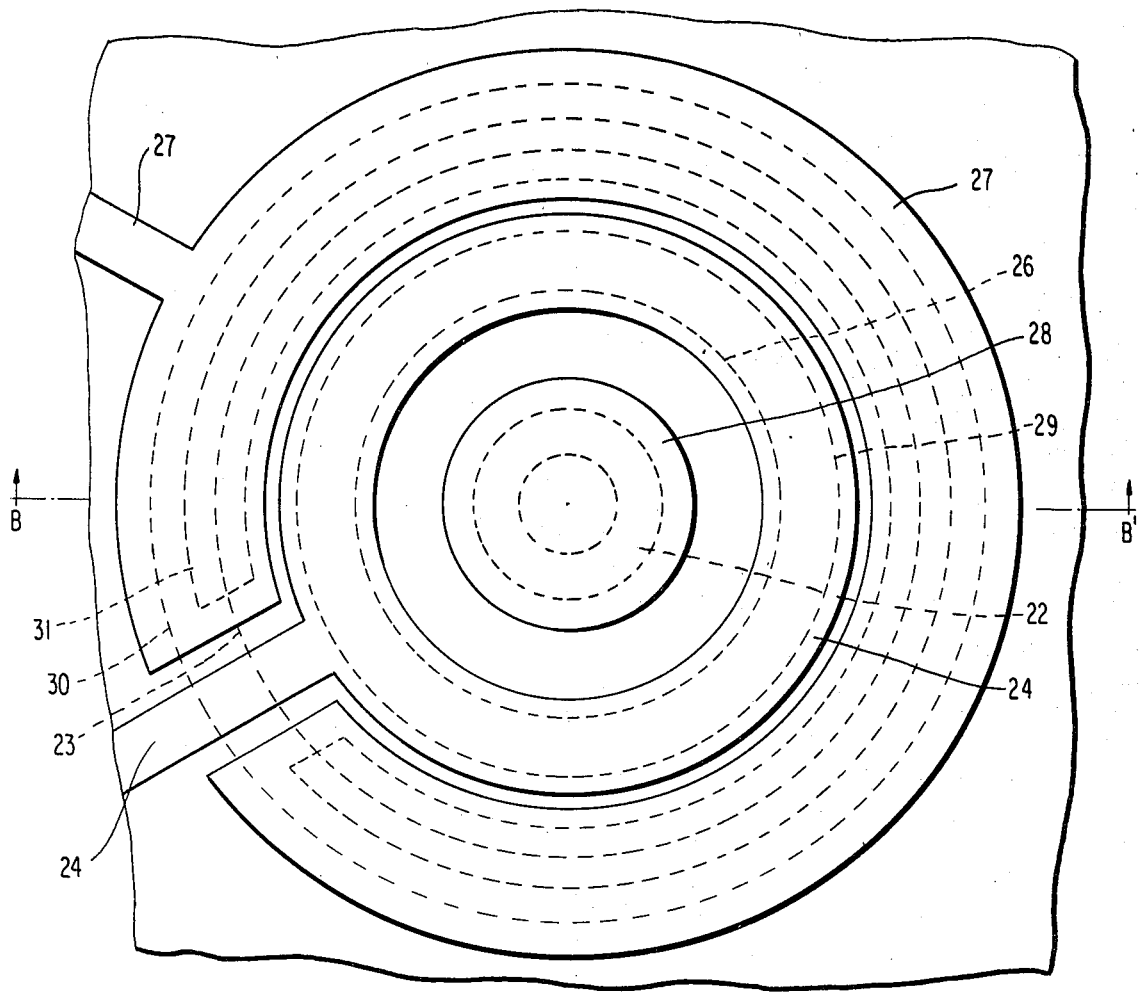
FIG. 8A is a plan view showing a practical structure of the first preferred embodiment shown in FIG. 4.
Figure 8B:
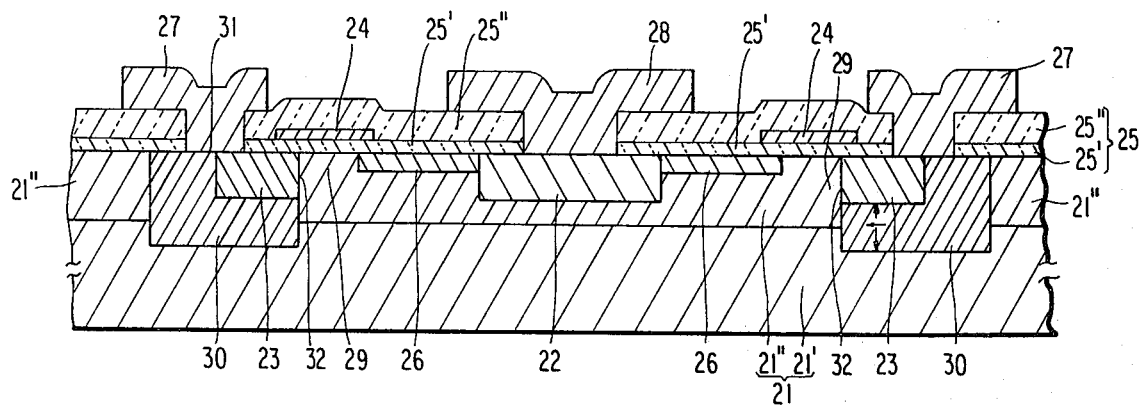
FIG. 8B is a cross-sectional view taken along line B-B' in FIG. 8A as viewed in the direction of the arrows.

FIGS. 8A and 8B illustrate the preferred embodiment of the present invention shown in FIG. 4 in a more practical form, and they show one example of a high breakdown voltage MOS transistor having a ring-shaped offset gate structure. In these figures, component parts having the same functions as those shown in FIG. 4 are designated by like reference numerals.

On a P-type semiconductor body 21' having an impurity concentration of $5 \times 10^{14}$ cm$^{-3}$ is formed a P-type epitaxial layer 21" having an impurity concentration of $5 \times 10^{14}$ cm$^{-3}$ and a thickness of 3 μm to form, as a whole, a P-type semiconductor substrate 21 having a low impurity concentration. In this substrate 21, around an N$^+$-type drain region 22 having a depth of 2 μm at the center are concentrically formed an N$^-$-type offset gate region 26 extending from the drain region 22 to the extent of 30 μm, an N$^+$-type source region 23 having a depth of 1 μm, and a gate electrode 24 having a radial length of 20 μm right above a channel region 29. In addition, a P$^+$-type high impurity concentration region 30 characteristic of the present invention is provided so as to have an impurity concentration of $10^{19}$ cm$^{-3}$ and a depth as measured from the bottom of the source region 23 of 4 μm and so as to make contact with substantially all of the bottom surface and the outer circumferential surface of the ring-shaped source region 23, and the region 30 is connected to a source electrode 27. An insulation film 25 on the surface of the device consists of a gate insulating film 25' of 1300 Å in thickness and a phosphorous glass layer 25" of 1 μm in thickness. With the above-described construction, the phenomenon of the negative resistance characteristic as referred to previously was not observed at all and a drain breakdown voltage of 350 V was obtained. This drain breakdown voltage is extremely high as compared to the drain breakdown voltage of at most 220 V which is obtainable with the prior art transistor shown in FIG. 3 in a ring gate structure. The P$^+$-type region 30 in the above-described structure could be formed through any one of the processes shown in FIGS. 5A to 5E, FIGS. 6A and 6B, and FIG. 7A and 7B.

Figure 9A:
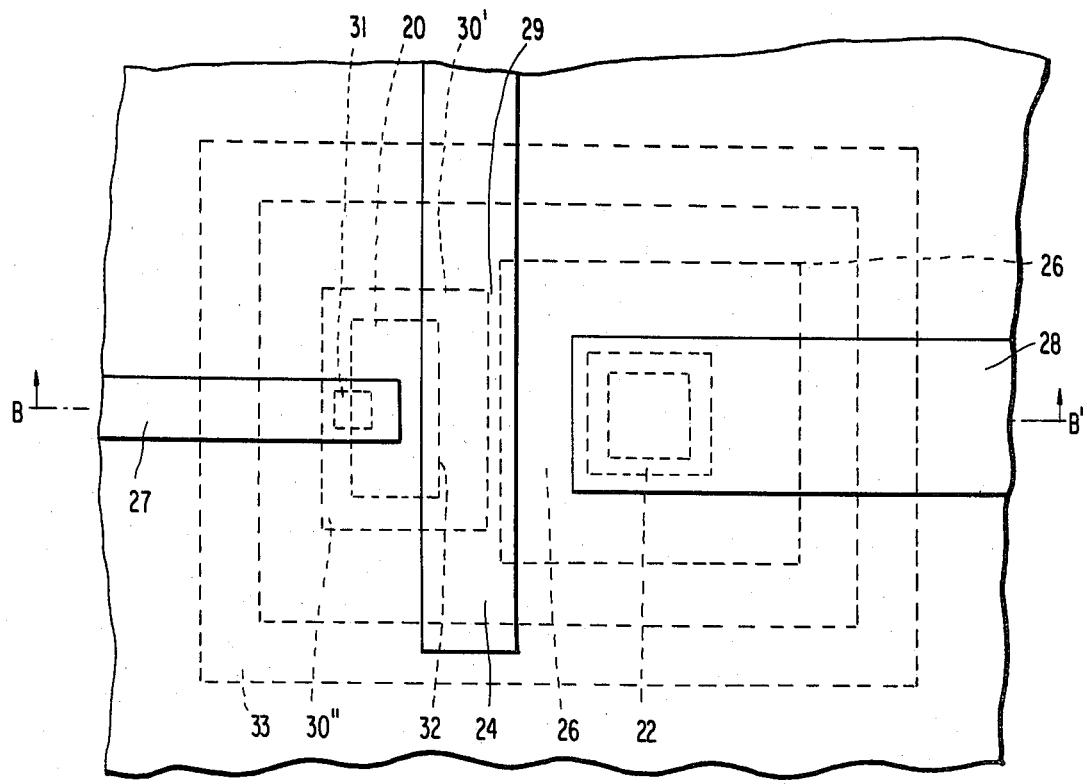
FIG. 9A is a plan view showing another practical structure of the first preferred embodiment shown in FIG. 4.
Figure 9B:
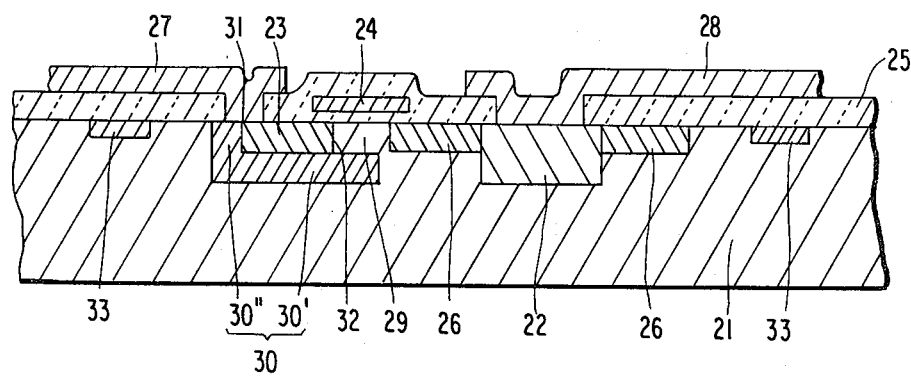
FIG. 9B is a cross-sectional view taken along line B-B' in FIG. 9A as viewed in the direction of the arrows.

FIGS. 9A and 9B illustrate another practical example of the preferred embodiment shown in FIG. 4, and in these figures also, component parts having the same functions as those shown in FIG. 4 are designated by like reference numerals.

In the illustrated example, the transistor according to the present invention is provided within an active region of a P$^-$-type semiconductor substrate surrounded by a P$^+$-type channel stopper region 33. A P$^+$-type high impurity concentration region 30 characteristic of the present invention which is formed of a buried earth layer 30' and a P$^+$-type diffused layer 30" for leading out the buried earth layer up to the surface of the substrate, projects from a bottom of a source region 23 up to the proximity of an offset gate region 26. Such a projected region would have an enhanced punch-through prohibit effect.

Figure 10:
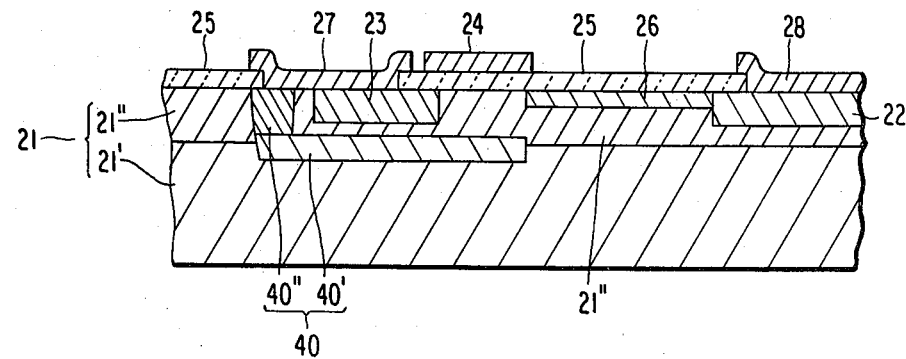
FIGS. 10 and 11 are cross-sectional views respectively showing outlines of a second preferred embodiment of the present invention and one modification thereof.
Figure 11:
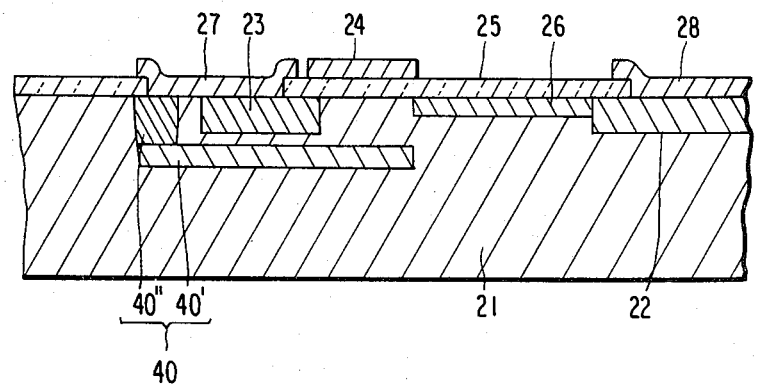

FIGS. 10 and 11, respectively, illustrate another preferred embodiment of the present invention and one modification thereof. In these figures, component parts having the same functions as those shown in FIGS. 4 and 5 are designated by like reference numerals. In these preferred embodiments, since the P$^+$-type high impurity concentration region characteristic of the present invention is separated from the N$^+$-type source region 23, the source breakdown voltage becomes high, and hence these devices are suitable to be used, for instance, as a load transistor.

At first, the preferred embodiment shown in FIG. 10 will be described. A low impurity concentration region 21" consisting of a P-type silicon layer having an impurity concentration of about $4 \times 10^{14}$ cm$^{-3}$ and a thickness of about 2 μm is grown on a low impurity concentration semiconductor body 21' made of P-type silicon having an impurity concentration of $4 \times 10^{14}$ cm$^{-3}$ to form, as a whole, a P-type silicon substrate 21. A buried layer 40' consisting of a P$^+$-type high impurity concentration region having an impurity concentration of about $1 \times 10^{19}$ cm$^{-3}$ is formed on the low impurity concentration semiconductor body 21' through a thermal diffusion process before the low impurity concentration layer 21" is epitaxially grown. A P$^+$-type diffused layer 40" having an impurity concentration of about $1 \times 10^{20}$ cm$^{-3}$ serves to lead out the buried layer 40' up to the surface of the low impurity concentration layer 21'. The layer 40' and the layer 40" jointly form the P$^+$-type high impurity concentration region 40 characteristic of the present invention. In addition, a drain region 22 and a source region 23 respectively consisting of N$^+$-type high impurity concentration regions, are formed through a thermal diffusion process, and a offset gate region 26 consisting of an N$^-$-type low impurity concentration region formed as by an ion implantation process and having a thickness of about 1300 Å and an impurity concentration of about $3 \times 10^{16}$ cm$^{-3}$, extends from the drain region 22. On a gate insulating film 25 consisting of a silicon oxide film of about 1300 Å in thickness, is provided a gate electrode made of polysilicon or metal such as aluminum which has a low specific resistance, and on the drain region 22 and source region 23, respectively, are provided a drain electrode 28 and a source electrode 27, respectively, made of metal such as aluminum. In the illustrated embodiment, the source electrode 27 serves to electrically connect the diffused layer 40" with the source region 23. One end of the buried layer 40' is led out up to the surface of the low impurity concentration region 21" via the diffused layer 40" while surrounding the source region 23, and it is electrically connected to the source region 23 via the source electrode 27. On the other hand, the other end of the buried layer 40' extends up to a position just under the offset gate region 26. The position of the other end of the buried layer 40' can be determined so that the drain breakdown voltage may not be lowered by the reach-through of the depletion layer extending from the drain region 22. More particularly, although the drain breakdown voltage was restricted by the reach-through in the high impurity concentration body 9 of the depletion layer extending from the drain region 11 in the prior art structure shown in FIG. 3 so far as the present epitaxial technique concerns, according to the present invention the depletion layer extending from the drain region 22 can well extend to the low impurity concentration semiconductor body 21' through the low impurity concentration region 21", and hence it is possible to realize a high breakdown voltage.

On the other hand, if avalanche breakdown should occur in the drain region 22, the hole current flowing into the low impurity concentration layer 21″ or into the low impurity concentration semiconductor body 21′ would be immediately derived to an external circuit through the buried layers 40′ and 40″. Since the buried layers 40′ and 40″ have a low resistance, they do not generate a voltage drop of such extent that injection of electrons from the source region 23 may be induced.

In the embodiment illustrated in FIG. 10, the impurity concentrations of the low impurity concentration semiconductor body 21′ and the low impurity concentration layer 21″ could be different. For instance, it is possible to achieve threshold value control of the device by selecting the impurity concentration of the low impurity concentration layer 21″ in the neighborhood of $10^{16}$ cm$^{-3}$. As described above, in the embodiment shown in FIG. 10, control for the threshold value vs voltage can be achieved taking into consideration the drain breakdown voltage. In the case of applying the insulated gate field effect transistors according to the present invention to an integrated circuit, the above-mentioned one end of the buried layer is electrically connected to the lowest potential used within the integrated circuit in the case of N-channel devices, while it is electrically connected to the highest potential used within the integrated circuit in the case of P-channel devices.

In the modified embodiment shown in FIG. 11, in a low impurity concentration semiconductor substrate 21 made of P-type silicon having an impurity concentration of about $4 \times 10^{14}$ cm$^{-3}$ are provided a buried layer 40′ consisting of a P+-type high impurity concentration region formed through ion implantation of boron and a P+-type high impurity concentration diffused layer 40″. In the manufacture of the illustrated device, at first the diffused layer 40″ for leading out the buried layer 40′ up to the surface is provided in the low impurity concentration semiconductor substrate 21, and thereafter the buried layer 40′ is formed through ion implantation of boron. The drain region 22 could be formed simultaneously under the same condition when the source region 23 is formed. In addition, in the case of enhancing the destruction-resistivity by increasing the junction depth of the drain region 22, the drain region 22 should be formed as by a thermal diffusion process before the buried layer 40′ is formed. In the case where an epitaxial layer is not employed, as is the case with the above-described in FIG. 11, reduction of the cost of the devices can be realized.

What is claimed is:

1. An insulated gate field effect transistor comprising a semiconductor substrate of one conductivity type, a source region and a drain region of the opposite conductivity type provided along one principal surface of said semiconductor substrate, a channel region between said source region and said drain region, a gate electrode provided on said channel region via a gate insulating film, and an impurity region of said one conductivity type having a higher impurity concentration than said semiconductor substrate, said impurity region being provided in contact with substantially the entire bottom of said source region excluding the side wall of said source region facing said channel region, said impurity region being led out to said one principal surface through a portion of said substrate other than said channel region and being ohmically connected to a source electrode jointly with said source region, said impurity region having an impurity concentration of $1 \times 10^{18}$ cm$^{-3}$ or higher, said semiconductor substrate having a bottom surface opposite to said one principal surface, said semiconductor substrate between said drain region and said bottom surface having an impurity concentration less than $1 \times 10^{18}$ cm$^{-3}$.

2. An insulated gate field effect transistor as claimed in claim 1, in which said semiconductor substrate includes a semiconductor base body of said one conductivity type having a lower impurity concentration than said impurity region and a semiconductor layer of said one conductivity type formed on said semiconductor base body and having a lower impurity concentration than said impurity region.

3. An insulated gate field effect transistor comprising a semiconductor substrate of one conductivity type, source and drain regions of the opposite conductivity type formed in one principal surface of said semiconductor substrate, an offset gate region of the opposite conductivity type having a lower impurity concentration than that of said drain region and being formed along said major surface and abutted against said drain region and extending towards said source region, a channel portion between said source region and said offset gate region, a gate insulating film on said channel portion, a gate electrode on said gate insulating film, and a buried layer of said one conductivity type and having higher impurity concentration than that of said semiconductor substrate, said buried layer being formed under substantially the entire bottom of said source region and being led out to said principal surface through a portion of said substrate other than said channel portion, said buried layer having an impurity concentration of $1 \times 10^{18}$ cm$^{-3}$ or higher, said semiconductor substrate having a bottom surface opposite to said one principal surface, and said buried layer not extending between said drain region and said bottom surface of said semiconductor substrate.

4. An insulated gate field effect transistor as claimed in claim 3, in which said buried layer extends up to a location right under the end of said offset gate region.

5. An insulated gate field effect transistor comprising a semiconductor substrate of one conductivity type, a drain region of the opposite conductivity type provided along one principal surface of said semiconductor substrate, an offset gate region of said opposite conductivity type having a lower impurity concentration than said drain region and a shallower depth than said drain region, said offset gate region extending from said drain region and disposed so as to surround said drain region, a channel region formed in a ring shape surrounding said offset region, a ring-shaped gate electrode provided on said channel region via a gate insulating film, a source region of the opposite conductivity type formed in a ring shape surrounding said channel region with its inner circumference adjoining the channel region, an impurity region of said one conductivity type having a higher impurity concentration than said semiconductor substrate, said impurity region contacting with substantially the entire bottom surface of said source region, said impurity region adjoining the outer circumference of said source region and being led out to said one principal surface of the semiconductor substrate, and a source electrode connected in common to said source region and said impurity region, said impurity region having an impurity concentration of $1 \times 10^{18}$ cm$^{-3}$ or higher, said semiconductor substrate having a bottom surface opposite to said one principal surface, and said impurity region not extending between said drain region and said bottom surface of said semiconductor substrate.

6. An insulated gate field effect transistor as claimed in claim 2, wherein said semiconductor layer is an epitaxial layer of relatively small thickness as compared to said semiconductor base body, said semiconductor layer and said semiconductor base body having substantially equivalent impurity concentrations.

7. An insulated gate field effect transistor as claimed in claim 3, wherein said source region and said buried layer are commonly connected, and wherein said buried layer substantially surrounds the outer peripheral surface of said source region.

8. An insulated gate field effect transistor as claimed in claim 7, wherein said buried layer abuts said source region along the bottom and outer peripheral surfaces thereof.

9. An insulated gate field effect transistor as claimed in claim 7, wherein said source region and said buried layer are separated by a low impurity concentration layer.

* * * * *

UNITED STATES PATENT AND TRADEMARK OFFICE
CERTIFICATE OF CORRECTION

PATENT NO. :   4,394,674
DATED      :   July 19, 1983
INVENTOR(S) :  Hiraku Sakuma et al It is certified that error appears in the above-identified patent and that said Letters Patent is hereby corrected as shown below:

Column 1, line 48, change "transistors" to --transistor--.

Column 1, line 49, change "transistor" to --transistors--.

Column 1, line 53, change "transistor" to --transistors--.

Column 2, line 10, change "is" to --are--.

Column 2, line 38, delete "that of than" and insert --than that of--.

Column 4, line 42, after "voltage" delete the ",".

Column 6, line 9, after "concentration", change "simicon-" to --semicon- --.

Column 6, line 19, after "the" change "vltage" to --voltage--.

Column 6, line 41, after "at" delete "the".

Column 7, line 14, after "the" change "sourceregion" to --source region--.

Signed and Sealed this

Twentieth Day of March 1984

[SEAL]

Attest:

Attesting Officer

GERALD J. MOSSINGHOFF
Commissioner of Patents and Trademarks